(12) United States Patent  
Draxelmayr

(10) Patent No.: US 7,248,106 B2  
(45) Date of Patent: Jul. 24, 2007

(54) SAMPLING SIGNAL AMPLIFIER

(75) Inventor: Dieter Draxelmayr, Villach (AT)

(73) Assignee: Infineon Technologies AG, Munich (DE)

( * ) Notice: Subject to any disclaimer, the term of this patent is extended or adjusted under 35 U.S.C. 154(b) by 206 days.

(21) Appl. No.: 11/127,045

(22) Filed: May 10, 2005

(65) Prior Publication Data

US 2005/0270071 A1 Dec. 8, 2005

(30) Foreign Application Priority Data

May 10, 2004 (DE) .................. 10 2004 022 991

(51) Int. Cl.
  *H03F 1/02* (2006.01)
  *H03L 5/00* (2006.01)
(52) U.S. Cl. ........................... 330/9; 327/307
(58) Field of Classification Search ............... None
  See application file for complete search history.

(56) References Cited

U.S. PATENT DOCUMENTS

| | | | |
|---|---|---|---|
| 4,783,602 A | 11/1988 | Viswanathan | |
| 6,369,652 B1 * | 4/2002 | Nguyen et al. | 330/253 |
| 6,710,645 B2 * | 3/2004 | Isken et al. | 330/9 |
| 6,937,078 B2 * | 8/2005 | Schrodinger | 327/165 |
| 7,057,460 B2 * | 6/2006 | Kaviani et al. | 330/261 |

\* cited by examiner

*Primary Examiner*—Benny T. Lee  
*Assistant Examiner*—Krista Flanagan  
(74) *Attorney, Agent, or Firm*—Maginot, Moore & Beck

(57) ABSTRACT

A sampling differential amplifier for amplification of a signal having: a signal input (2) for application of an input signal to be amplified; signal amplification transistors (N1, $\overline{N1}$) whose control connections are connected via sampling capacitors (CA, $\overline{CA}$) to the signal input (2); with the signal amplification transistors (N1, $\overline{N1}$) each being connected via series-connected load resistances ($R_{L1}$, $R_{L2}$) to a positive supply voltage ($V_{DD}$) and via current source (N3) to a negative supply voltage ($V_{SS}$); a signal output (3) for emitting an amplified output signal, with the signal output (3) being tapped off the signal amplification transistors (N1, $\overline{N1}$); and having sampling switching transistors (N2, $\overline{N2}$), which are each connected between the series-connected load resistances ($R_{L1}$, $R_{L2}$) and a control connection of one signal amplification transistor (N1, $\overline{N1}$), with the control connection of the sampling switching transistors (N1, $\overline{N1}$) being connected to a control signal input (13) for application of a sampling control signal.

20 Claims, 7 Drawing Sheets

Sampling differential amplifier

Sampling differential amplifier

Sampling control signal

SAMPLING SIGNAL AMPLIFIER

FIELD OF THE INVENTION

The invention relates to a sampling signal amplifier for amplification of a signal, which amplifier is suitable in particular for use as a comparator.

BACKGROUND

FIGS. 1a, 1b show sampling signal amplifiers according to the prior art, with FIG. 1a showing a simple embodiment and FIG. 1b showing a differential embodiment. The sampling signal amplifiers are used for sampling and amplification of an analogue input signal which is applied to a signal input E, with the amplified signal being emitted via a signal output A. For this purpose, the sampling signal amplifier according to the prior art, and as is illustrated in FIGS. 1a, 1b, contains a sampling capacitor CA and an inverting amplifier, whose output is fed back via a control switch to the input. The control switch is driven by a sampling control signal.

FIG. 2 shows a further sampling differential amplifier according to the prior art, which has particularly simple circuitry. The sampling differential amplifier is in a differential form and contains signal amplification transistors N1, $\overline{N1}$ which, in the embodiment illustrated in FIG. 2, are in the form of NMOS field-effect transistors. Sampling capacitors CA, $\overline{CA}$ are connected to the gate connections of the signal amplification transistors, and are connected to a signal input E. The input signal to be amplified is applied to the signal input E. The source connections of the signal amplification transistors N1, $\overline{N1}$ are connected via an NMOS transistor N3 to a negative supply voltage $V_{ss}$ with the NMOS transistor N3 forming a current source. For this purpose, a bias voltage is applied to the gate connection of the transistor N3. The drain connections of the signal amplification transistors N1, $\overline{N1}$ are connected via load resistances RL and $\overline{RL}$ to a positive supply voltage $V_{DD}$. Furthermore, the signal output A of the sampling differential amplifier is tapped off the drain connections of the NMOS field-effect transistors N1, $\overline{N1}$.

The sampling differential amplifier according to the prior art, as it is illustrated in FIG. 2, also contains sampling switching transistors N2, $\overline{N2}$, which likewise are NMOS transistors. The gate connections of the NMOS transistors N2, $\overline{N2}$ are connected to a control input, to which a sampling control signal is applied. The sampling control signal is a periodic signal, with the two sampling switching transistors N2, $\overline{N2}$ being switched on in the first clock phase or sampling phase. This sampling phase is also referred to as the compensation phase or auto-zero phase, since the applied input voltage is at the same time stored with the offset-voltage of the amplifier stage by the sampling capacitors CA, $\overline{CA}$. In a second clock phase, the sampling switching transistors N2, $\overline{N2}$ are opened, so that the sampling amplifier reacts sensitively to changes in the input voltage.

The gain of the sampling signal amplifier, as it is illustrated in FIG. 2, that is to say the ratio of the output voltage $V_{out}$ to the input voltage $V_{in}$, depends on the gradient of the signal amplification transistors N1, $\overline{N1}$ and the voltage drop across the load resistances RL, $\overline{RL}$.

Thus:

$$K = \frac{V_{out}}{V_{in}} \approx RL \cdot gm \quad (1)$$

The signal gain K is thus directly proportional to the voltage drop across the load resistance RL.

The disadvantage of the sampling differential amplifier according to the prior art, as it is illustrated in FIG. 2, is that the sampling differential amplifier cannot produce any significant signal gains at very low supply voltages $V_{DD}$-$V_{ss}$ of, for example, less than 1 volt. This is because, if the supply voltage $V_{DD}$-$V_{ss}$ falls, the voltage drop across the load resistance $R_L$ decreases, and the signal gain likewise decreases.

A sampling differential amplifier with the circuitry shown in FIG. 3 has thus been proposed. In the sampling differential amplifier according to the prior art as illustrated in FIG. 3, current sources are connected in parallel with the load resistances RL, $\overline{RL}$. The current sources are formed by field-effect transistors to whose gate connections a bias voltage is applied. As the bias voltage Vbias1 increases, the current $I_{SQ}$ in each case produced by a current source increases, so that if the current $I_{N1}$ which is flowing through the signal amplification transistor N1 is constant, the current $I_{RL}$ flowing through the load resistance RL decreases. It is thus possible to increase the load resistance RL so that the signal gain K of the sampling differential amplifier is increased.

However, the sampling differential amplifier according to the prior art as illustrated in FIG. 3 likewise has a number of significant disadvantages. The circuitry complexity is increased by the current sources which must additionally be provided. Furthermore, the parasitic capacitances increase. In addition, a mismatch can occur between the current sources (which are connected in parallel with the load resistances) and the current source N3, so that it is necessary to provide a common-mode feedback circuit.

SUMMARY

The object of the present invention is thus to provide a sampling signal amplifier which avoids the disadvantages resulting from the prior art and, in particular, ensures high signal gain even when the supply voltage is low.

This object is achieved by a sampling differential amplifier and by a sampling amplifier according to the present invention.

The invention provides a sampling differential amplifier for amplification of a signal, having a signal input for application of an input signal to be amplified, signal amplification transistors whose control connections are connected via sampling capacitors to the signal input, with the signal amplification transistors each being connected via series-connected load resistances to a positive supply voltage ($V_{DD}$) and via current source to a negative supply voltage ($V_{ss}$), a signal output for emitting an amplified output signal, with the signal output being tapped off the signal amplification transistors, and having sampling switching transistors, which are each connected between the series-connected load resistances and a control connection of one signal amplification transistor, with the control connections of the sampling switching transistors being connected to a control signal input for application of a sampling control signal.

In one preferred embodiment, the first series-connected load resistances are formed by transistors.

In another embodiment, the current source is likewise formed by a transistor.

In a first alternative embodiment, the transistors are formed by bipolar transistors.

In an alternative embodiment, the transistors are formed by field-effect transistors.

The voltage differences between the positive supply voltage and the negative supply voltage are preferably less than 1 volt.

The sampling control signal for driving the sampling circuit transistors is preferably a periodic square-wave signal.

In one preferred embodiment, the sampling differential amplifier has a shift limiting circuit.

The invention also provides a sampling amplifier for amplification of a signal having a signal input for application of an input signal to be amplified, a signal amplification transistor having a first connection, a second connection and a control connection, with its control connection being connected via a sampling capacitor to the signal input, and with the first connection of the signal amplification transistor being connected via series-connected load resistances to a positive supply voltage, and the second connection being connected to a negative supply voltage, having a signal output for emitting an amplified output signal, with the signal output being tapped off the first connection of the signal amplification transistor, and having a sampling switching transistor, which is connected between the series-connected load resistances and the control connection of the signal amplification transistor, with the control connection of the sampling switching transistor being connected to a control signal input for the application of a sampling control signal.

Preferred embodiments of the sampling signal amplifier according to the invention will be described in the following text with reference to the attached figures, in order to explain the features which are significant to the invention.

DETAILED DESCRIPTION

Figure 4:
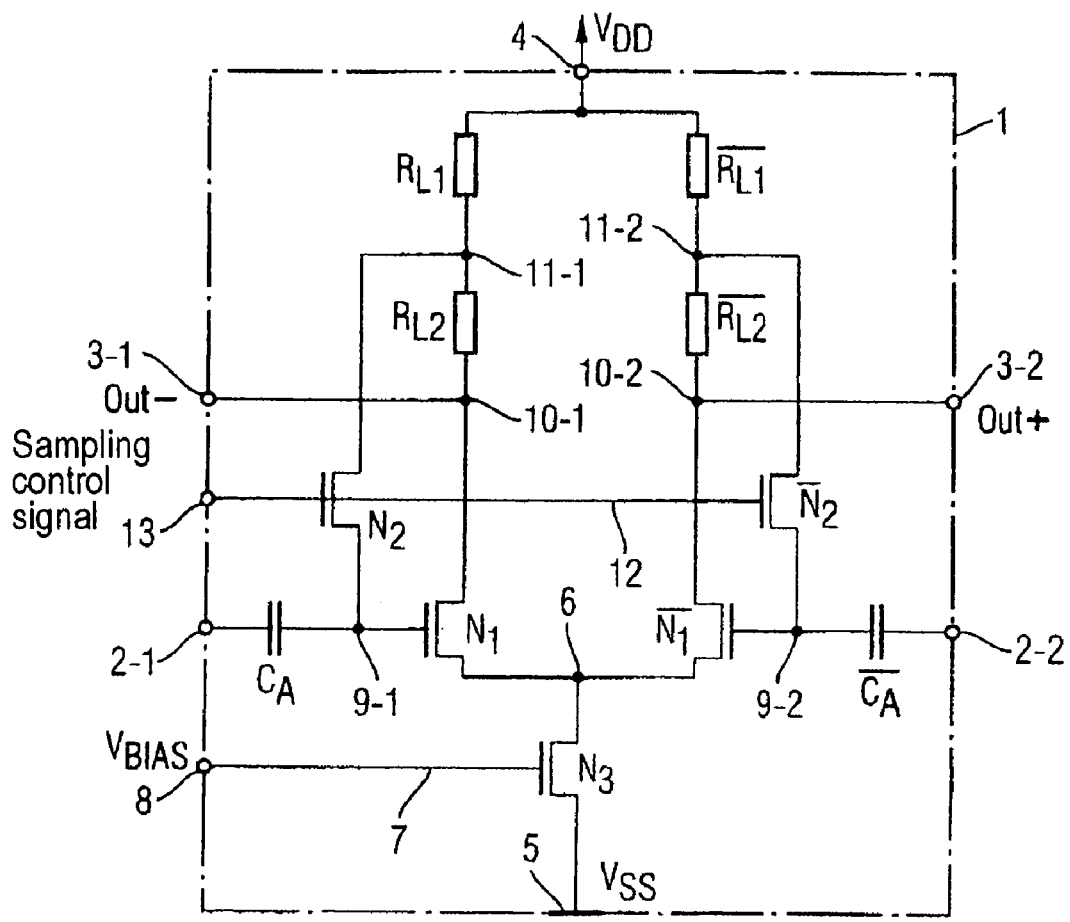
FIG. 4 shows a first embodiment of the sampling signal amplifier according to the invention.

As can be seen from FIG. 4, the first embodiment of the sampling signal amplifier 1 has a signal input 2-1, 2-2 to which an input signal to be amplified can be applied. In the first embodiment, as illustrated in FIG. 4, the sampling signal amplifier 1 is in the form of a differential amplifier. The sampling differential amplifier 1 also has a signal output 3-1, 3-2 for emitting an inverted, amplified output signal.

The sampling differential amplifier 1 is connected to a positive supply voltage $V_{DD}$ and to a negative supply voltage $V_{ss}$. For this purpose, the sampling differential amplifier 1 has a positive supply voltage connection 4 and a negative supply voltage connection 5.

The sampling differential amplifier 1 contains signal amplification transistors N1, $\overline{N1}$ which, in the embodiment illustrated in FIG. 4, are in the form of NMOS transistors. The source connections of the signal amplification transistors N1, $\overline{N1}$ are connected to one another at a node 6. A current source N3 is provided between the node 6 and the connecting node 5 for the negative supply voltage $V_{ss}$, with the current source N3 being formed by an NMOS transistor. The gate connection of the NMOS transistor N3 is connected via a line 7 to a voltage connection 8 of the sampling differential amplifier 1, with a bias voltage $V_{bias}$ being applied to the voltage connection. The bias voltage $V_{bias}$ controls the current source N3. The gate connections of the signal amplification transistors N1, $\overline{N1}$ are connected to nodes 9-1, 9-2, with sampling capacitors CA, $\overline{CA}$ being connected between the signal input 2 and each of the nodes 9.

The drain connections of the signal amplification transistors N1, $\overline{N1}$ are connected to nodes 10-1, 10-2. The output signal connections 3-1, 3-2 of the sampling differential amplifier 1 are tapped off the nodes 10-1, 10-2.

Two series-connected load resistances RL1, RL2 are respectively connected between the supply voltage connection 4 and the nodes 10-1, 10-2. The two load resistances RL1, RL2 and $\overline{RL1}$, $\overline{RL2}$ are connected in series with one another at a node 11-1, 11-2. The sampling differential amplifier 1, as it is illustrated in FIG. 4, also contains sampling switching transistors N2, $\overline{N2}$, which are respectively connected between the series-connected load resistances RL1, RL2 and the nodes 9-1 and 9-2. The sampling switching transistors N2, $\overline{N2}$ in the embodiment illustrated in FIG. 4 are likewise formed by NMOS transistors. The gate connections of the sampling switching transistors N2, $\overline{N2}$ are connected to one another via a line 12. The line 12 is connected to a control connection 13 of the sampling differential amplifier 1.

Figure 7:
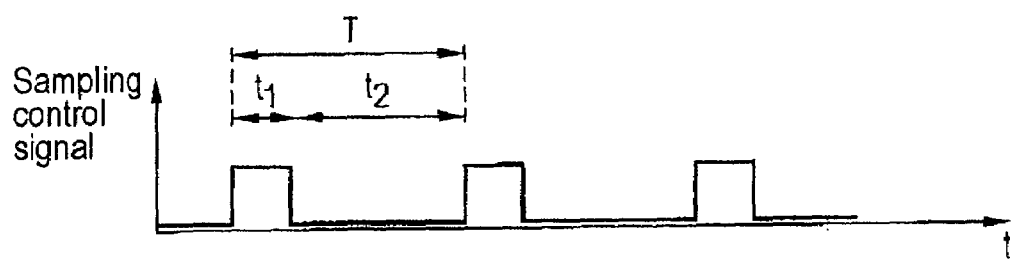
FIG. 7 shows a timing diagram of a sampling control signal as is used for the sampling signal amplifier according to the invention.

A sampling control signal is applied to the control input 13, and is preferably a periodic square-wave signal, as is illustrated by way of example in FIG. 7.

In a first sampling phase of time duration t1, the two sampling switching transistors N2, $\overline{N2}$ are switched on, and connect the gate connections of the signal amplification transistors N1, $\overline{N1}$ in each case to the centre tap 11-1, 11-2 of the two series-connected load resistances RL1, RL2 and $\overline{RL1}$, $\overline{RL2}$, respectively. The input voltage which is applied to the signal input 2 is stored by the sampling capacitors CA, $\overline{CA}$.

After the sampling phase, the sampling switching transistors N2, $\overline{N2}$ are opened for a time period t2 by the sampling control signal. The time period t2 is considerably shorter than the discharge time of the sampling capacitors CA, $\overline{CA}$. In this signal amplification phase, that is to say during the time period t2, the sampling differential amplifier 1 according to the invention reacts sensitively to sudden voltage changes at the signal input 2. In this case, the sampling differential amplifier 1 according to the invention and as it is illustrated in FIG. 4 has a higher signal gain for the same supply voltage than the conventional sampling differential amplifier according to the prior art, as it is illustrated by way of example in FIG. 2.

Figure 1A:
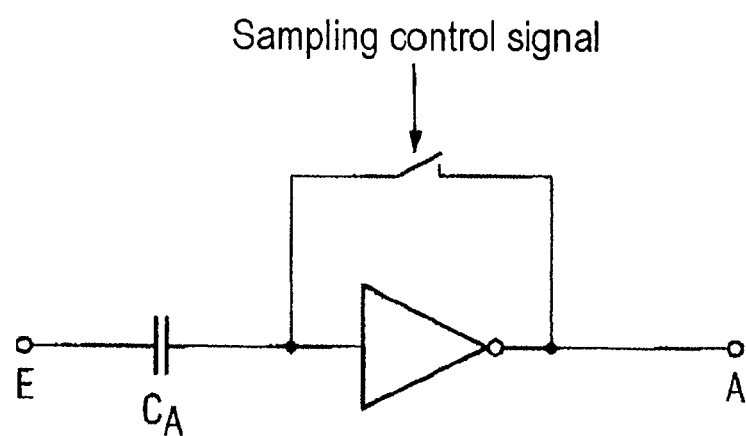
FIGS. 1a, 1b show sampling signal amplifiers according to the prior art.
Figure 1B:
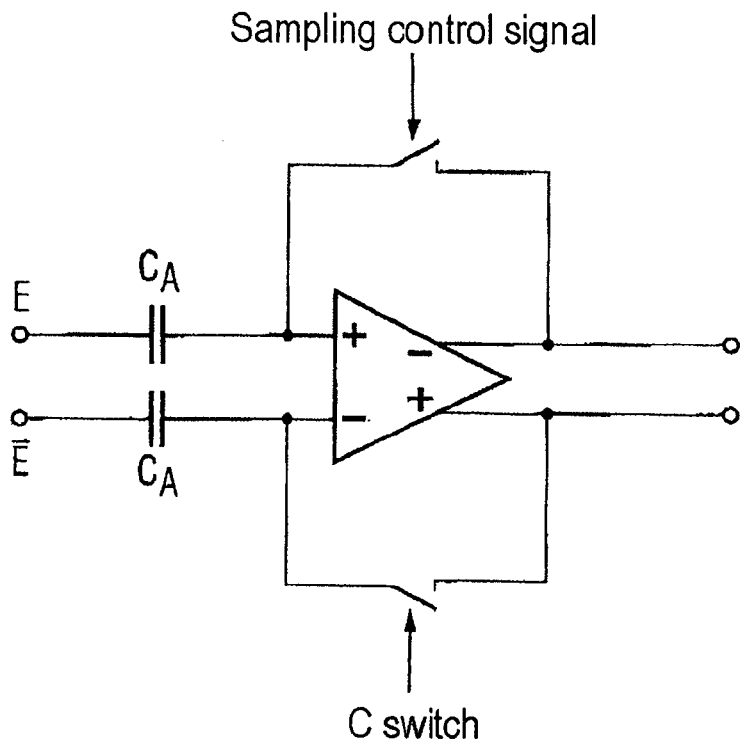
Figure 2:
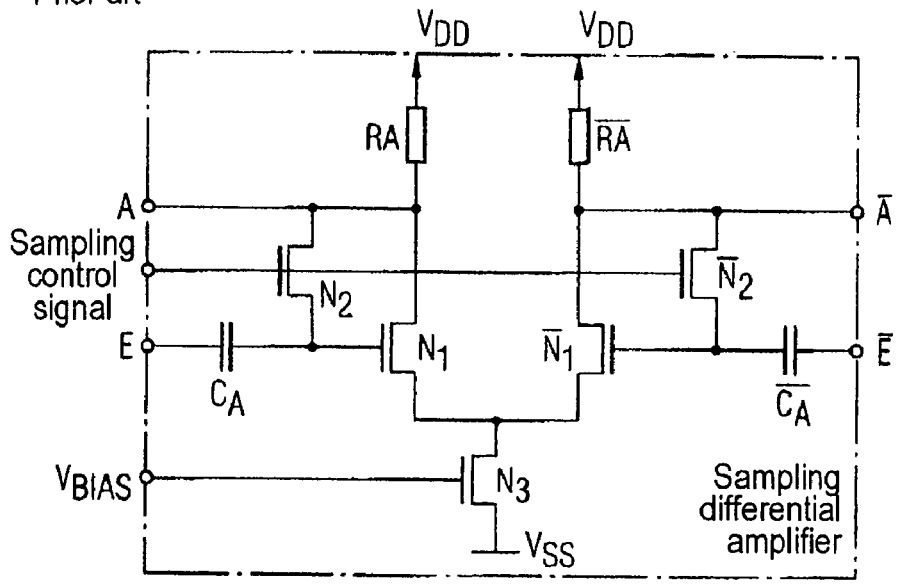
FIG. 2 shows a further sampling differential amplifier according to the prior art.
Figure 3:
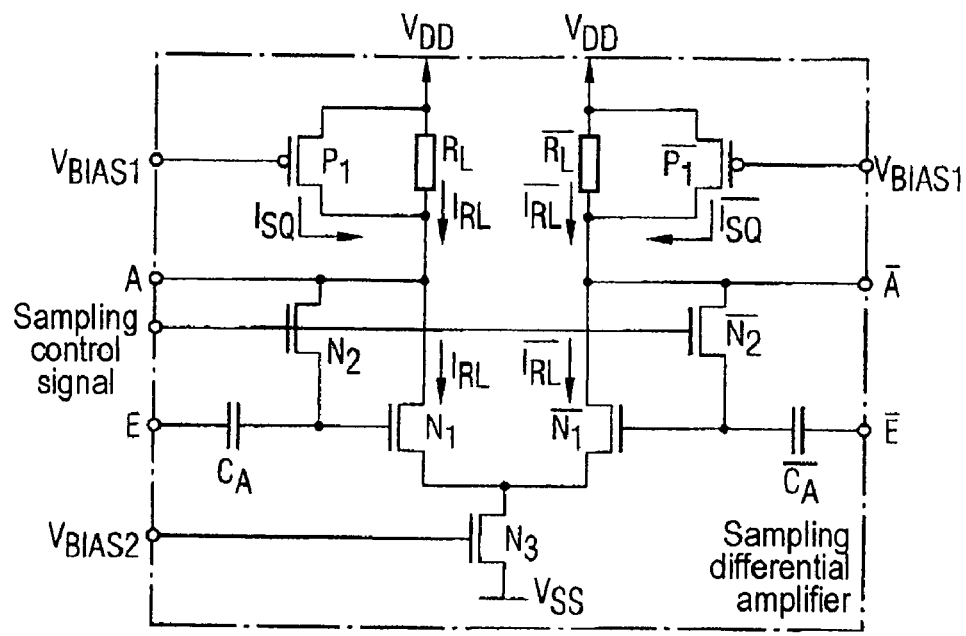
FIG. 3 shows a further sampling differential amplifier according to the prior art.

In the conventional sampling differential amplifier as shown in FIG. 2:

$$V_{sat_{N3}}+V_{tot_{N1}}+V_{RL} \leq V_{DD}-V_{SS} \quad (2)$$

with the gain K1 of the conventional sampling differential amplifier as shown in FIG. 2 being proportional to the voltage $V_{RL}$ dropped across the load resistance RL:

$$K1 \approx V_{RL} \quad (3)$$

In contrast, for the sampling differential amplifier 1 according to the invention, as it is illustrated in FIG. 4:

$$V_{sat_{N1}}+V_{tot_{N1}}+V_{RL1} \leq V_{DD}-V_{SS} \quad (4)$$

with the gain K2 of the sampling differential amplifier 1 according to the invention being proportional to the voltage which is dropped across the two series-connected load resistances RL1, RL2:

$$K2 \approx V_{RL1}+V_{RL2} \quad (5)$$

If the signal gain is assumed to be the same (K1=K2) that is to say $$V_{RL}=V_{RL1}+V_{RL2} \quad (6)$$

then:

$$V_{sat_{N3}}+V_{tot_{N1}}+(V_{RL}-V_{RL2}) \leq V_{DD}-V_{SS} \quad (7)$$

As can be seen from equation 7, in the case of the sampling differential amplifier 1 according to the invention and with the same signal gain, a lower supply voltage ($V_{DD}-V_{SS}$) is required or, for the same supply voltage ($V_{DD}-V_{SS}$), the sampling differential amplifier 1 according to the invention has a higher signal gain K than the conventional sampling differential amplifier according to the prior art, as it is illustrated in FIG. 2. According to the invention, this is achieved by the splitting of the load resistance $R_L$ into two series-connected load resistances RL1, RL2, with the sampling switching transistor N2 being connected to the junction point between the two load resistances. The sampling differential amplifier 1 according to the invention thus has the same supply voltage and a higher signal gain K than the conventional sampling differential amplifier, without increasing the circuitry complexity. Conversely, the supply voltage between $V_{DD}-V_{SS}$ is reduced for the sampling differential amplifier 1 according to the invention if the original signal gain is satisfactory.

In the embodiment illustrated in FIG. 4, the transistors are formed by field-effect transistors. In an alternative embodiment, the transistors are formed by bipolar transistors. Mixed embodiments are also possible, with some of the transistors being in the form of field-effect transistors and some of the transistors being in the form of bipolar transistors. In a first embodiment, the sampling differential amplifier 1 in this case contains NMOS transistors and npn bipolar transistors. In an alternative embodiment, the sampling differential amplifier contains PMOS transistors and pnp bipolar transistors.

The sampling differential amplifier 1 according to the invention is supplied with a supply voltage of less than 1 volt, in one preferred embodiment.

Figure 5:
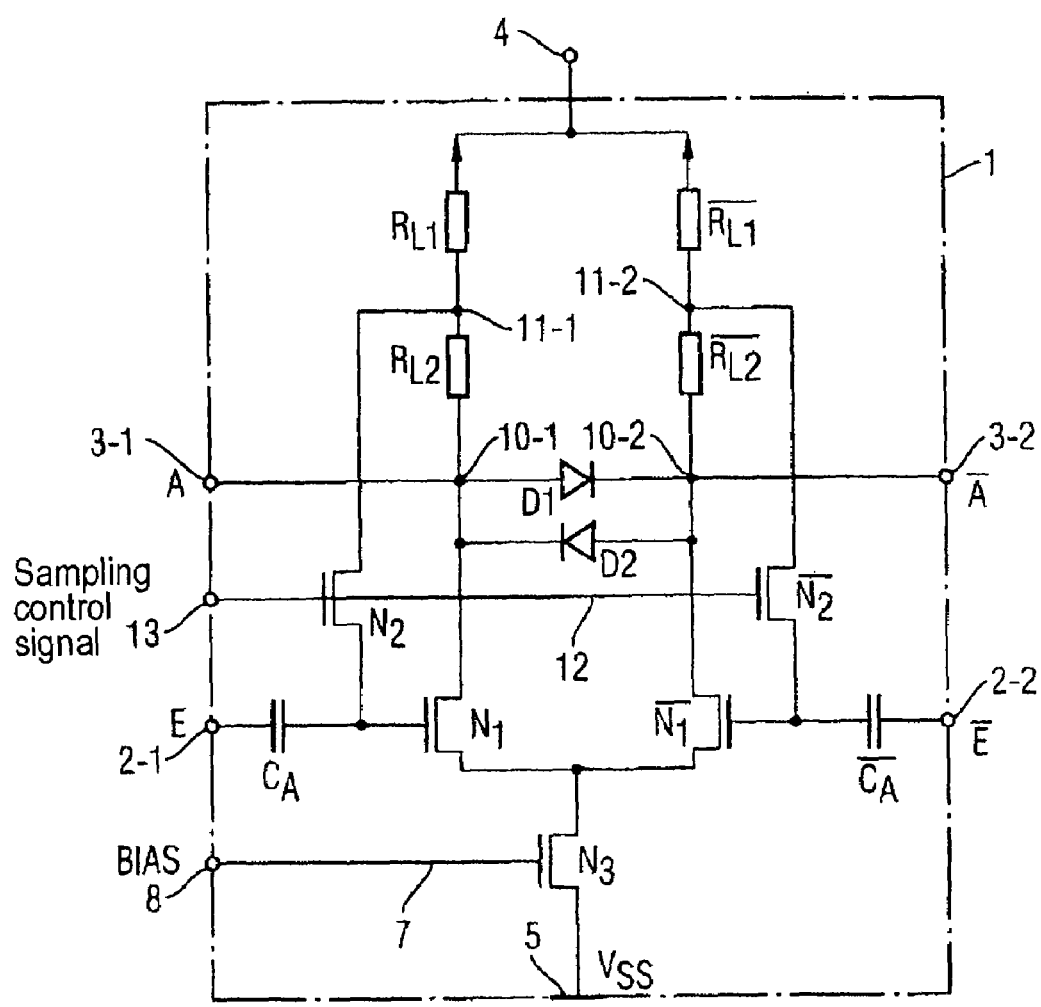
FIG. 5 shows a second embodiment of the sampling signal amplifier according to the invention.

FIG. 5 shows a further preferred embodiment of the sampling differential amplifier 1 according to the invention. In the second embodiment, which is illustrated in FIG. 5, the sampling differential amplifier 1 advantageously contains a shift limiting circuit. This shift limiting circuit is formed by two diodes D1, D2, connected back-to-back in parallel, in the embodiment illustrated in FIG. 5. The shift limiting circuit results in a faster recovery time in the event of overdriving. The two embodiments illustrated in FIGS. 4 and 5 are differential.

Figure 6:
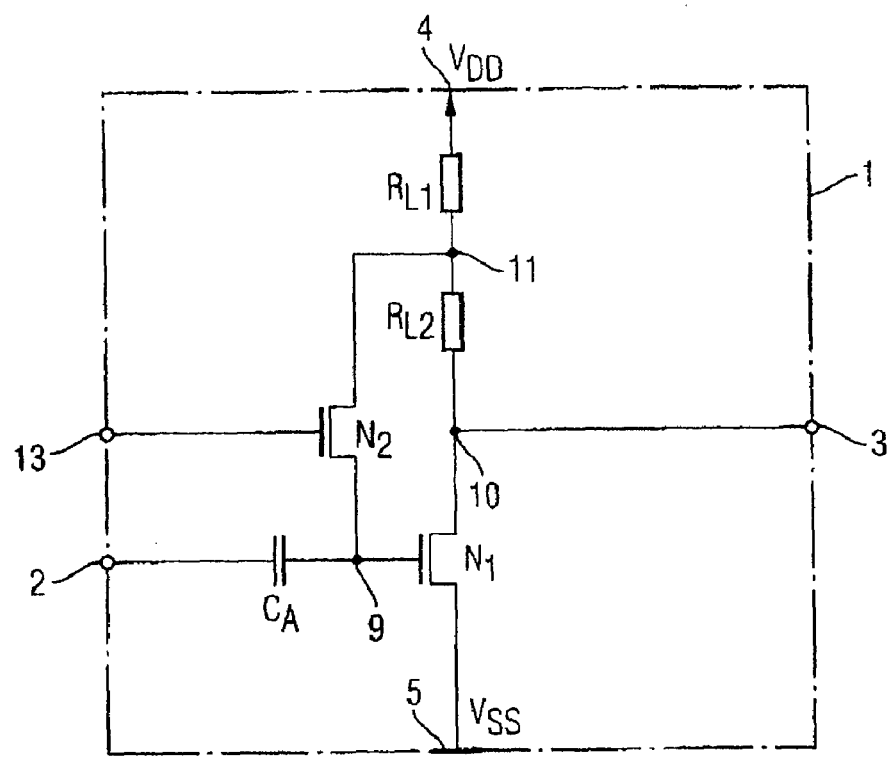
FIG. 6 shows a third embodiment of the sampling signal amplifier according to the invention.

FIG. 6 shows a third embodiment of the sampling signal amplifier according to the invention, in which the sampling signal amplifier is single-ended, for amplification and/or comparison of non-differential input signals.

FIG. 7 shows signal diagrams in order to explain the methods of operation of the sampling signal amplifier 1 according to the invention. The sampling signal amplifier 1 according to the invention is suitable for use as a comparator circuit. If the input signal $V_{in}$ at the signal input 2 of the sampling differential amplifier 1 is greater than the voltage potential at the signal input 2 at the sampling time, the negative supply voltage $V_{SS}$ is, virtually, emitted at the signal output 3 of the sampling differential amplifier 1 (which in this case is in the form of an inverting amplifier). If the voltage from the signal input 2 falls below the potential at the sampling time, the sampling differential amplifier 1 emits virtually a positive supply voltage $V_{DD}$.

Figure 8:
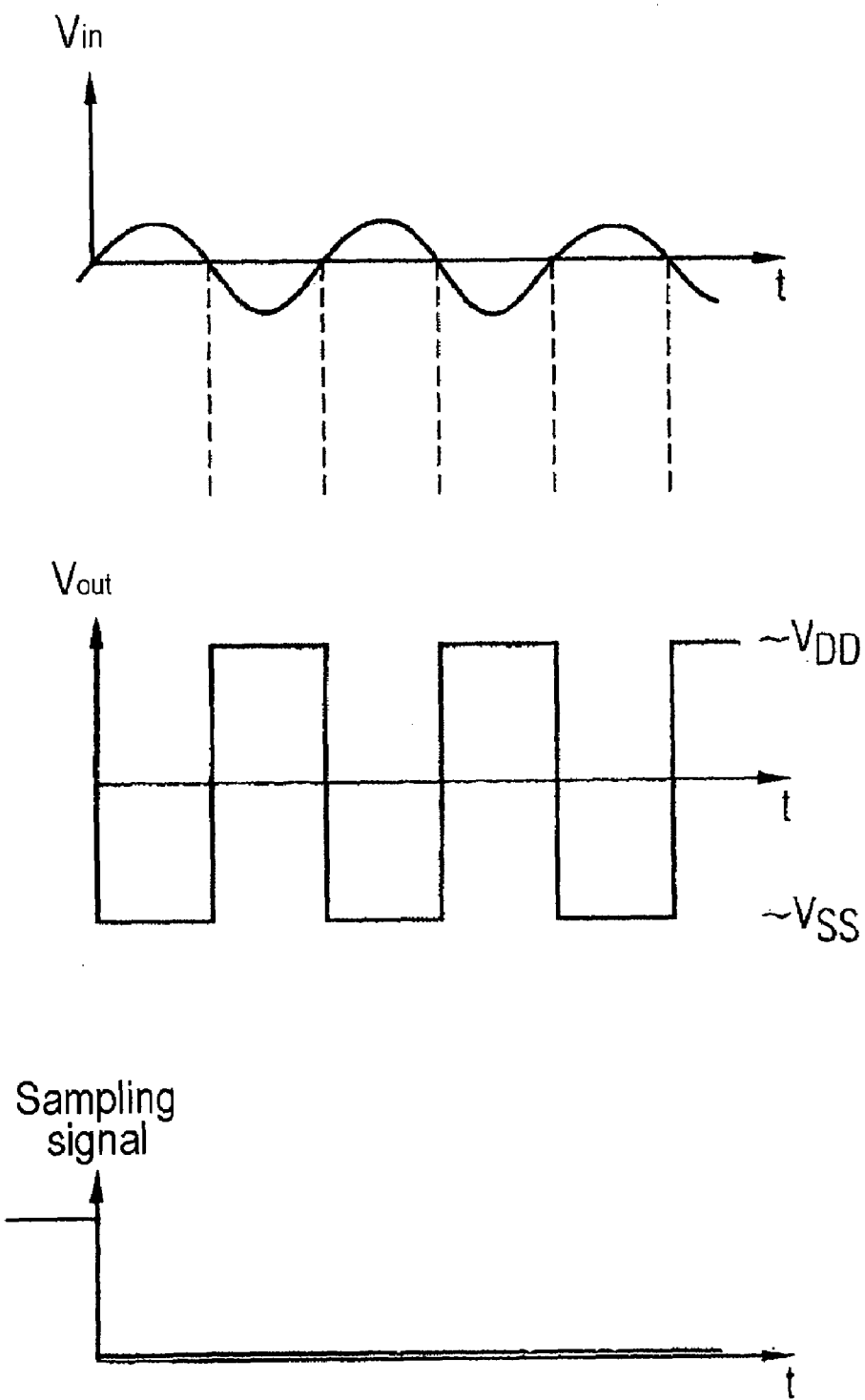
FIG. 8 shows a signal diagram in order to explain the method of operation of the sampling signal amplifier according to the invention as a comparator.

By way of example, FIG. 8 shows a sinusoidal input signal Vin at the signal input 2 of the sampling differential amplifier 1 during the signal amplification phase. The illustration also shows a corresponding output signal $V_{out}$ and one possible sampling signal profile. In this case, particularly in the case of the output signal illustrated in FIG. 8, it should be noted that the described exemplary embodiments are in the form of inverting sampling differential amplifiers.

Figure 9:
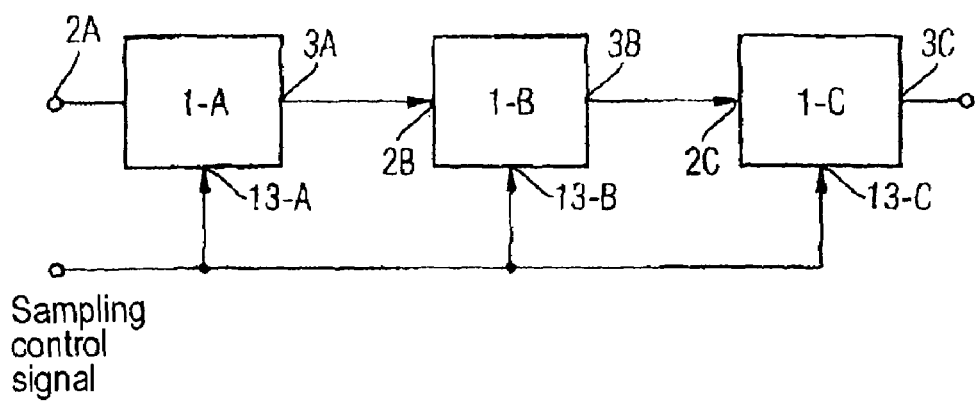
FIG. 9 shows a block diagram of a number of series-connected sampling signal amplifiers according to the invention.

FIG. 9 shows a number of sampling differential amplifiers 1 according to the invention connected in series. In this case, in each case one signal input of the sampling differential amplifier 1-i is connected to the signal output of the preceding sampling differential amplifier 1-(i−1). The sampling differential amplifiers 1 preferably receive the sampling control signal in parallel.

Connection of the sampling differential amplifiers 1 in series allows a virtually ideal comparator characteristic to be achieved.

Figure 10A:
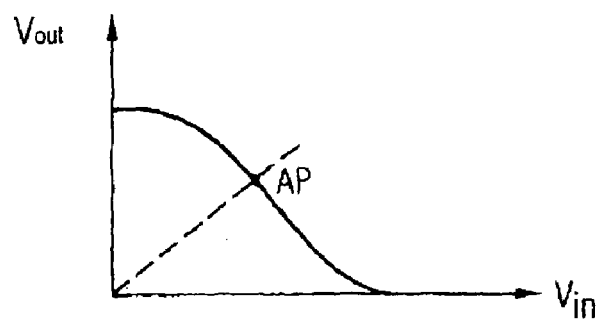
FIGS. 10a, 10b show characteristics in order to explain the method of operation of the sampling signal amplifier according to the invention.
Figure 10B:
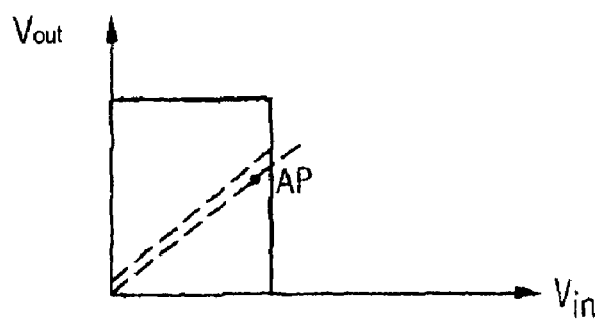

FIG. 10a shows the non-ideal characteristic of a sampling differential amplifier stage 1 according to the invention. The sampling differential signal amplifier 1 according to the invention is an inverting amplifier with a non-ideal characteristic, with the operating point AP depending on the magnitudes of the two load resistances RL1, RL2. The connection of a number of sampling differential amplifiers 1 according to the invention in series results in a virtually ideal comparator characteristic, as is illustrated in FIG. 10b. A comparator such as this has no hysteresis.

Transistors with a high threshold voltage are preferably used for the sampling signal amplifier 1 according to the invention.

The sampling signal amplifier 1 according to the invention can be used as a comparator, or else as a switched capacitor amplifier.

The two load resistances RL1, RL2 are preferably likewise formed by transistors. The sampling amplifier 1 according to the invention has less circuitry complexity, and can be integrated easily.

Although the invention has been explained with reference to specific exemplary embodiments, it is not restricted to them. In particular, the sampling amplifiers according to the invention may also be designed in a non-inverting form. Even though, by way of example, implementations with NMOS transistors have been described, it is also possible to use PMOS transistors, which require generally known, simple specialist circuit modifications. It is also easily possible to use mixed circuitry comprising, for example, PMOS transistors as signal amplification transistors and NMOS transistors as sampling switching transistors.

Furthermore, it is also possible to use other relevant shift limiting circuits than the diodes connected back-to-back in parallel as shown, by way of example, in FIG. 5.

LIST OF REFERENCE SYMBOLS 1 sampling signal amplifier
2 signal input
3 signal output
4 supply voltage connection
5 supply voltage connection
6 node
7 line
8 voltage connection
9 node
10 node
11 node
12 line
13 control connection

The invention claimed is:

1. A sampling differential amplifier for amplification of a signal having:
   (a) a signal input configured to receive an input signal to be amplified;
   (b) at least one signal amplification transistor having a control connection that is connected via a sampling capacitor to the signal input, each of the at least one signal amplification transistors being connected via series-connected load resistances to a positive supply voltage and via current source to a negative supply voltage;
   (c) a signal output configured to provide an amplified output signal, the signal output being tapped off the signal amplification transistors; and
   (d) at least one sampling switching transistor connected between a node between the series-connected load resistances and a control connection of the at least one signal amplification transistor, the at least one sampling switching transistor having a control connection connected to a control signal input for application of a sampling control signal.

2. The sampling differential amplifier as claimed in claim 1, wherein the series-connected load resistances are formed by transistors.

3. The sampling differential amplifier as claimed in claim 1, wherein the current source is formed by a transistor.

4. The sampling differential amplifier as claimed in claim 1, wherein the at least one signal amplification transistor and the at least one sampling switching transistor are bipolar transistors.

5. The sampling differential amplifier as claimed in claim 1, wherein the at least one signal amplification transistor and the at least one sampling switching transistor are field-effect transistors.

6. The sampling differential amplifier as claimed in claim 1, wherein the voltage difference between the positive supply voltage and the negative supply voltage is less than one volt.

7. The sampling differential amplifier as claimed in claim 1, wherein the sampling control signal is a periodic square-wave signal.

8. The sampling differential amplifier as claimed in claim 1, further comprising a shift limiting circuit.

9. The sampling differential amplifier as claimed in claim 8, wherein the signal output includes first and second differential outputs, and wherein the shift limiting circuit includes first and second oppositely biased diodes coupled between first and second differential outputs.

10. A sampling amplifier for amplification of a signal having:
    (a) a signal input configured to receive an input signal to be amplified;
    (b) a signal amplification transistor having a first connection, a second connection and a control connection, the control connection connected via a capacitor to the signal input, the first connection of the signal amplification transistor connected via series-connected load resistances to a positive supply voltage, and the second connection connected to a negative supply voltage;
    (c) a signal output configured to provide an amplified output signal, the signal output being tapped off the first connection; and
    (d) a sampling switching transistor connected to a node between the series-connected load resistances and to the control connection of the signal amplification transistor, the sampling switching transistor having a control connection connected to a control signal input for application of a sampling control signal.

11. The sampling amplifier as claimed in claim 10, wherein the series-connected load resistances are formed by transistors.

12. The sampling amplifier as claimed in claim 10, wherein the signal amplification transistor and the sampling switching transistor are bipolar transistors.

13. The sampling differential amplifier as claimed in claim 10, wherein the signal amplification transistor and the sampling switching transistor are field-effect transistors.

14. The sampling differential amplifier as claimed in claim 10, wherein the voltage difference between the positive supply voltage and the negative supply voltage is less than one volt.

15. A sampling amplifier for amplification of a signal having:
    (a) a signal input configured to receive an input signal to be amplified;
    (b) at least one signal amplification transistor having a control connection that is connected via a sampling capacitor to the signal input, each of the at least one signal amplification transistors being connected via series-connected load resistances to a first supply voltage and to a second supply voltage, the difference between the first supply voltage and the second supply voltage being less than one volt;
    (c) a signal output configured to provide an amplified output signal, the signal output being tapped off the signal amplification transistors; and having
    (d) at least one sampling switching transistor connected to a node between the series-connected load resistances and to a control connection of the at least one signal amplification transistor, the at least one sampling switching transistor having a control connection connected to a control signal input for application of a sampling control signal.

16. The sampling amplifier as claimed in claim 15, wherein the series-connected load resistances are formed by transistors.

17. The sampling amplifier as claimed in claim 15, wherein the series-connected load resistances consist of at least one set of two series-connected load resistances.

18. The sampling differential amplifier as claimed in claim 15, further comprising a current source coupled between the at least one signal amplification transistors and the second supply voltage.

19. The sampling differential amplifier as claimed in claim 15, wherein the at least one signal amplification transistor and the at least one sampling switching transistor are bipolar transistors.

20. The sampling differential amplifier as claimed in claim 15, wherein the at least one signal amplification transistor and the at least one sampling switching transistor are field-effect transistors.

* * * * *